United States Patent [19]
Sato et al.

[11] Patent Number: 4,945,317
[45] Date of Patent: Jul. 31, 1990

[54] MATCHING CIRCUIT

[75] Inventors: Tutomu Sato, Kawasaki; Haruhiko Yura, Yokohama; Yoshihiko Nasu, Tokyo; Atsumi Fujiwara, Tokyo; Shigeo Mori, Tokyo, all of Japan

[73] Assignees: Nippon Hoso Kyokai, Tokyo; Kabushiki Kaisha Toshiba, Kawasaki, Japan

[21] Appl. No.: 246,780

[22] Filed: Sep. 20, 1988

[30] Foreign Application Priority Data

Sep. 22, 1987 [JP] Japan .................. 62-238140
Sep. 22, 1987 [JP] Japan .................. 62-238141

[51] Int. Cl.$^5$ ............................................. H03H 7/00
[52] U.S. Cl. ................................. 330/301; 330/116; 333/25
[58] Field of Search ............... 330/116, 117, 207 A, 330/251, 301; 333/25, 26; 343/859

[56] References Cited

U.S. PATENT DOCUMENTS 4,717,896 1/1988 Graham .................... 333/25
4,766,402 8/1988 Crane ....................... 333/25
4,800,344 1/1989 Graham .................... 333/25

FOREIGN PATENT DOCUMENTS 3111983 10/1982 Fed. Rep. of Germany .

OTHER PUBLICATIONS

"Broadcasting Machine", of Broadcasting Technique Series Book; 1.2.2.(4), Power Amplifier (PA).
Nikkei Electronics, May 2, 1977; PP118 et seq.; "Transmission Path Type Matching Transformer Capable of Readily Handling KW-Class Power".

Primary Examiner—Steven Mottola
Attorney, Agent, or Firm—Oblon, Spivak, McClelland, Maier & Neustadt

[57] ABSTRACT

A matching circuit is connected between a source circuit and a load circuit. The matching circuit is made up of an impedance transforming circuit and a balance-to-unbalance signal-transforming circuit. If necessary, means for blocking the DC components intervene between those transforming circuits. The impedance transforming circuit is made up of inductive and capacitive elements. The matching circuit is reversible.

14 Claims, 3 Drawing Sheets

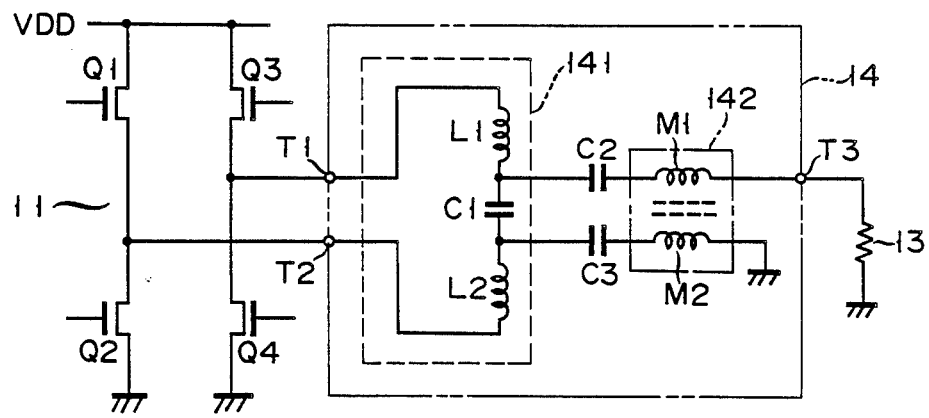

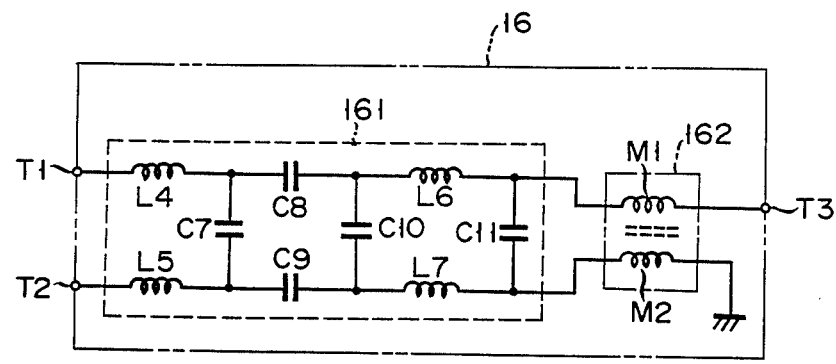
F I G. 6
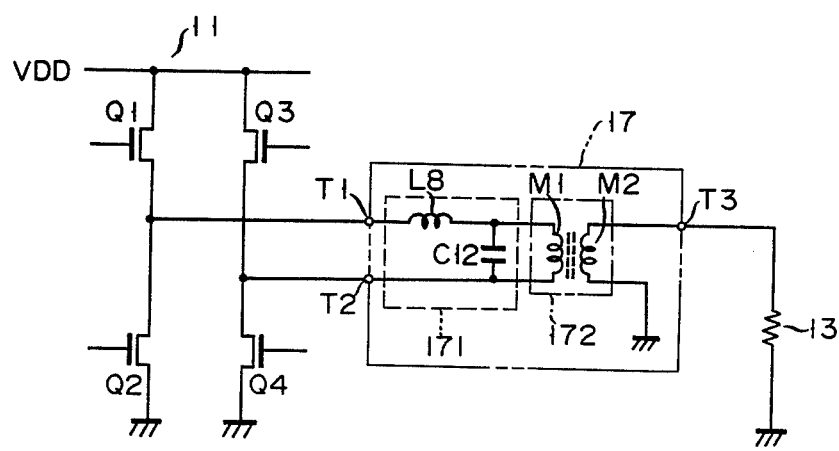
F I G. 7

MATCHING CIRCUIT

BACKGROUND OF THE INVENTION

1. Field of the Invention

This invention relates to a matching circuit, which transforms, for example, an impedance of a source circuit of the balanced type (or the unbalanced type) into that of a load circuit of the unbalanced type (or the balanced type), while transforming a balanced (or an unbalanced) signal into an unbalanced (or a balanced) signal.

2. Description of the Related Art

The high frequency power amplifier for a medium- or short-wave radio broadcasting solid-state transmitter has generally employed the class D/bridge circuit system, because it must handle a large high frequency power. In designing the amplifier, semiconductor elements such as field effect transistors (FETs), are usually used for its amplifying o active elements. With the limited tolerable power and the breakdown voltage of the elements, a balanced circuit system is employed for the amplifier circuit. On the other hand, a load circuit including a transmission antenna is of the unbalanced type, which is coupled for reception with the output of the amplifier. To match the impedance and the circuit system of the source and load circuits, a matching circuit has been inserted between those circuits. The matching circuit inserted must satisfy the following conditions:

(1) When the power source is grounded at one end, the circuit system including those source and load circuits is frequently designed so that the amplifier output is balanced with respect to ground, but the load input is unbalanced with respect to the same. Therefore, the matching circuit must match the balanced output of the amplifier and the unbalanced input of the load circuit.

(2) The output voltage of the amplifier, which operates in a class D mode, is rectangular in waveform. The rectangular wave voltage contains much harmonic components, in addition to the fundamental frequency components. Only the fundamental component is required for the signal to be transmitted to the load. To select only the fundamental component, the matching circuit must have a filter function, i.e., a band-pass or lowpass filtering. That is, the matching circuit must exhibit a low impedance for the fundamental component of the amplifier output, while exhibiting a high impedance for the harmonic components of the output current.

(3) In design, it is very difficult to match the input impedance of the load circuit with the optimum load impedance of the amplifier. Therefore, the matching circuit must match the amplifier output impedance with the load input impedance.

A prior matching circuit satisfying the above requirements is shown in FIG. 1.

In FIG. 1, high frequency power amplifier 11 is coupled through matching circuit 12 to load circuit 13. The matching circuit has a pair of input terminals T1 and T2, and an output terminal T3. Power amplifier 11 is made up of amplifying elements Q1 to Q4 connected in a bridge fashion between VDD power and ground lines. The junction points between elements Q1 and Q2, and between elements Q3 and Q4 are the output terminals of the amplifier. In operation, paired elements Q1 and Q4, and paired elements Q2 and Q3 are alternately operated. Thus, the output of power amplifier 11 is electrically balanced with respect to ground. Load circuit 13 with one end grounded is electrically unbalanced with respect to ground, as shown. In matching circuit 12, transformer 121 contained therein has a primary winding whose both ends are connected through input terminals T1 and T2 to the output terminals of the power amplifier. The secondary winding of the transformer is grounded at one end, and connected at the other end to the input terminal of load circuit 14, via LC bandpass filter 122 and output terminal T2.

In matching circuit 12 thus arranged, transformer 121 transforms the amplifier output impedance into the impedance of the load input impedance, and further transforms the balanced amplifier output into the unbalanced load input. To effect the impedance transformation, a turn ratio of the primary winding to the secondary winding of transformer 121 is properly selected. The rectangular wave signal induced into the secondary winding is filtered by the LC bandpass filter 122. This filter allows passage of only the fundamental frequency component contained in the rectangular wave signal, while rejecting the remaining frequency components.

The above arrangement of the matching circuit involves the following problems, however. The power amplified signal by amplifier 11 is a rectangular wave signal. Therefore, transformer 121 must handle the rectangular wave signal at low loss. As known, the rectangular wave signal contains much harmonic components, in addition to the significant fundamental frequency component. To handle this much-harmonics-contained signal at a low loss, the transformer must have a broad band frequency characteristic. Further, the power loss by the transformer, which appears as transformer heating, increases more as the frequency of the handled signal is higher. Therefore, as the fundamental frequency used is higher, the design of the transformer for it is more difficult. In the case of the transformer for handling such a high fundamental frequency, the number of turns of the windings must be small. The necessary turn ratio is also based on the small number of turns. This makes it difficult to obtain an optimum turn ratio for the impedance matching.

Thus, in the prior matching circuit, the transformer design is difficult particularly in high frequencies of the significant fundamental components. To the extreme, practically usable transformers cannot be designed.

SUMMARY OF THE INVENTION

Accordingly, an object of this invention is to provide a matching circuit which effects the impedance transformation and balance-to-unbalance transformation, free from the broad band and low loss problems, and difficulty of obtaining the optimum impedance transforming ratio.

According to one aspect of this invention, there is provided a matching circuit coupled between a source circuit of the balanced type and a load circuit of the unbalanced type comprising:

impedance transforming means coupled at the input with the source circuit, the impedance transforming means capacitively providing an output signal and exhibiting a low impedance for the frequency of a signal to be transmitted from the source circuit to the load circuit; and signal-transforming means for transforming a balanced signal into an unbalanced signal, the signal-transforming means including a transformer having first and second windings, the first winding being connected at one end with the output of the impedance transforming means, and at the second end with the load circuit, the second winding being connected at one end with the output of the impedance transforming means and at the other end to a ground point.

BRIEF DESCRIPTION OF THE DRAWINGS

FIGS. 5, 6, and 7 show circuit diagrams of matching circuits according to the 2nd, 3rd and 4th embodiments of this invention.

DETAILED DESCRIPTION OF THE PREFERRED EMBODIMENTS

Some specific embodiments of a matching circuit according to this invention will be described in detail referring to FIGS. 2 to 7.

Figure 1:
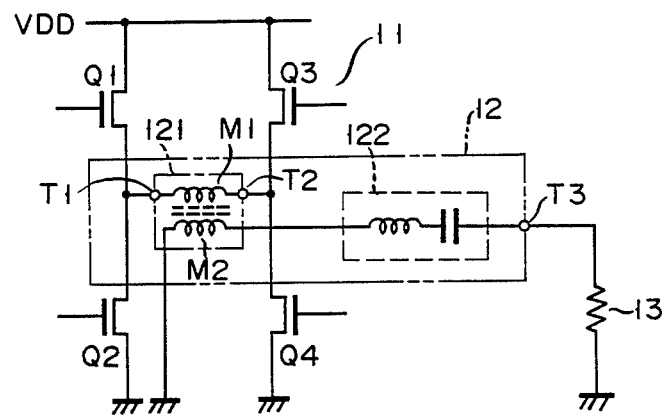
FIG. 1 shows a circuit diagram of a prior matching circuit.
Figure 2:
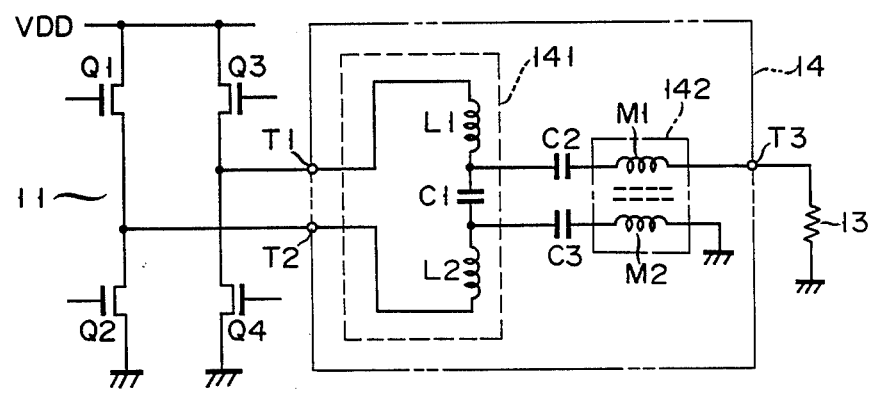
FIG. 2 shows a circuit diagram of a matching circuit of a first embodiment according to this invention.

A first preferred embodiment of a matching circuit according to this invention is shown in FIG. 2. For ease of explanation, like reference symbols are used for designating like or equivalent portions in FIG. 1.

In FIG. 2, matching circuit 14 is inserted between high frequency power amplifier 11 and load 13. Matching circuit 14 is comprised of impedance transforming circuit 141 and transmission transformer 142. Impedance transforming circuit 141 is made up of coils L1 and L2, and capacitor C1 inserted between coils L1 and L2. Transformer 142 is made up of a couple of windings M1 and M2. Impedance transforming circuit 141 and transmission transformer 142 are coupled to each other by means of a couple of coupling capacitors C2 and C3. Power amplifier 11 is connected in a bridge fashion, and operates in class D amplifying mode. The series circuit including coils L1 and L2, and capacitor C1, which makes up impedance transforming circuit 141, is inserted between the output terminals of power amplifier 11, through terminals T1 and T2. Capacitor C2 is connected between the junction point of coil L1 to capacitor C1, and one end of winding M1. Capacitor C3 is likewise connected between the junction point of capacitor C1 to coil L2, and one end of winding M2. The other end of winding M1 is connected to one end of load 13 whose other end is grounded. Winding M2 is grounded at the other end.

Figure 3:
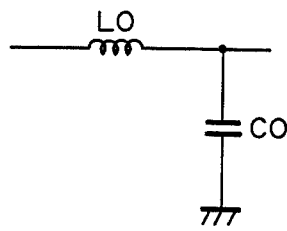
FIG. 3 shows an equivalent circuit of an impedance transforming circuit used in the FIG. 2 circuit.

Impedance transforming circuit 141, which is of the balanced type, is expressed by the known LC impedance transforming circuit consisting of coil L0 and capacitor C0 as shown in FIG. 3. To be more specific, inductance of coil L0 and capacitance of capacitor C0 are calculated so as to satisfy a desired impedance transforming ratio, i.e., a ratio used for transforming the output impedance of power amplifier 11 into the input impedance of load 13. A capacitor having a capacitance equal to the obtained capacitance is selected and used for capacitor C1. Coils each having half of the obtained inductance are selected and used for coils L1 and L2.

Coupling capacitors C2 and C3 block the DC voltage supplied from a VDD power source from going to the succeeding stage. Presence of these capacitors is negligible in this circuit operating in high frequencies, if capacitance of the capacitors is satisfactorily large. As a matter of course, the capacitance of capacitors C1 and C2 is large enough to exhibit satisfactorily low impedance for the operating frequency.

The number of turns of each winding M1 and M2 of transmission transformer 142 for balance-to-unbalance transformation, depends on the operating frequency, or the used fundamental frequency, of the signal propagating therethrough. The electrical length of each transformer M1 and M2 is ideally equal to $\frac{1}{4}$ of the wavelength of the operating frequency. Practically, however, it suffices that the blocked impedance for the operating frequency is approximately ten times the input impedance of load circuit 13.

With such an arrangement, matching circuit 14 is capable of making the output impedance of the balanced output of power amplifier 11 equal to the input impedance of the unbalanced input of load circuit 13. The output voltage of amplifier 11 is rectangular in waveform. A sinusoidal wave current substantially consisting of only the fundamental wave component, flows through impedance transforming circuit 141. This sinusoidal wave current causes a sinusoidal wave voltage to appear across capacitor C1. The sinusoidal wave voltage is balanced with respect to ground and depends on the impedance transforming ratio of impedance transformer 141. The sinusoidal wave current and voltage are further removed by capacitors C2 and C3, so that the DC component and low frequency components of them are removed. The voltage and current of the fundamental components are transmitted through transmission transformer 142, which is for converting the balanced system to the unbalanced system, and then reaches load circuit 13. The voltage and current passing through transmission transformer 142 substantially consist of the fundamental wave components. Therefore, the transformer is free from the heating due to the harmonic components. In other words, the transformer may effect the circuit system transformation with a little power loss due to the harmonics.

With such an arrangement, this embodiment successfully satisfies three requirements of filtering, circuit system transforming and impedance matching, by using relatively small normal transformers. Therefore, a designer may easily obtain the optimum impedance transforming ratio. The resultant matching circuit is free from the transformer heating problem due to the harmonics.

Figure 4:
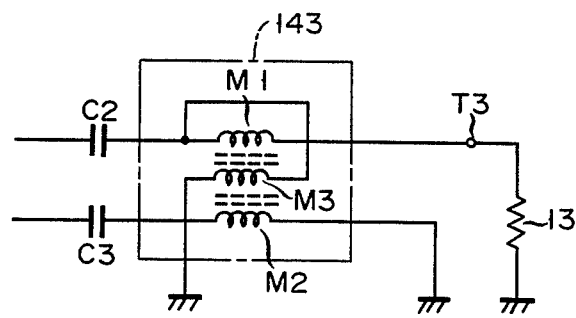
FIG. 4 shows a circuit diagram of an additional transformer which may be used in the FIG. 2 circuit.

In case that the blocked impedance of transmission transformer 142 cannot be large, 3-winding type transformer 143 may be used as shown in FIG. 4. As shown, first and second windings M1 and M2 are connected as in the transformer 142 of FIG. 2. Third winding M3 is connected at one end to the junction point between capacitor C2 and first winding M1, and is grounded at the other end, while being directed so that the direction of the current flowing through the third winding is opposite to that of the first winding. This wiring arrangement may reduce the mismatching, even if the blocked impedance is small.

Figure 5:
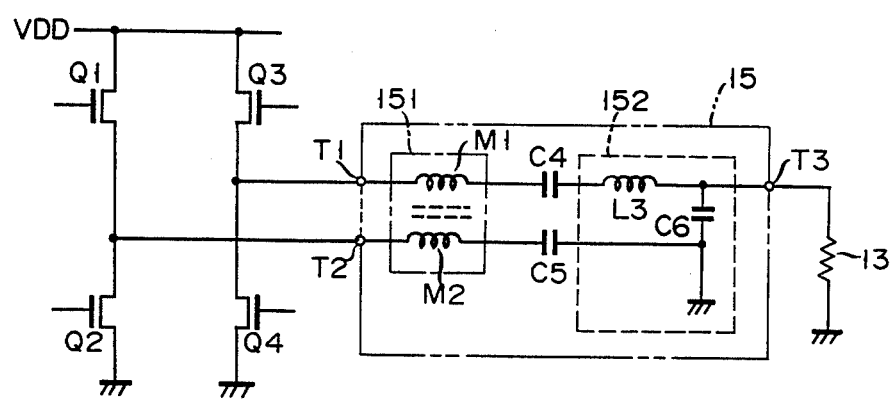

FIG. 5 shows a second embodiment of a matching circuit according to this invention. In this matching circuit 15, a pair of balanced output terminals of class D/bridge connected power amplifier 11 are connected to terminals T1 and T2 of matching circuit 15. The output terminal T3 of matching circuit 15 is connected to the input terminal of load circuit 13 whose input circuit consists of an unbalanced system. In this matching circuit 15, impedance transforming circuit 152 follows transmission transformer 151. These circuits 151 and 152 are coupled by coupling capacitors C4 and C5. Transmission transformer 151 is made up of coils M1 and M2. Impedance transforming circuit 152 consists of a series circuit including coil L3 and capacitor C6. One end of the series circuit is connected to capacitor C4, while the other end to ground and to coupling capacitor C5. A node between coil L3 and capacitor C6 is coupled with load circuit 13, via output terminal T3. The second embodiment under discussion allows use of impedance transforming circuit 152 of the unbalanced type. Hence, the circuit of FIG. 3 may be used for the impedance transforming circuit. This reduces the number of elements required for the matching circuit, and simplifies the circuit design. The transformer 143 in FIG. 4 may be used for the transformer 151.

A third embodiment of a matching circuit according to this invention is illustrated in FIG. 6. In matching circuit 16, impedance transforming or matching circuit 161 is followed by transmission transforming circuit 162, as in the first embodiment of FIG. 2. Impedance matching circuit 161 consists of a multi-stage bandpass filter made up of coils L4 to L7, and capacitors C7 to C11. In this circuit arrangement, capacitors C8 and C9 serve also as the coupling capacitors. The FIG. 4 transformer may be applied for transformer 162 for circuit system transformation. If impedance matching circuit 161 is so modified that the connection point of capacitor C11 to coil L7 is grounded, it may replace the impedance matching circuit 152 in FIG. 5.

A fourth embodiment of a matching circuit according to this invention is illustrated in FIG. 7. In matching circuit 17, impedance matching circuit 171 is placed at the prestige of transmission transformer 172 for effecting the balance-to-unbalance transformation. Impedance matching circuit 171 is made up of coil L8 and capacitor C12. Transmission transformer 172 substantially consists of primary winding M1 and secondary winding M2. In this embodiment, transmission transformer 171 shuts off the VDD going to load 13.

Also in this embodiment, the impedance transformation and the filtering for harmonics are effected by circuit 171. The balance-to-unbalance conversion is effected by transformer 172. The signal voltage across capacitor C12 is applied to transmission transformer 172. The signal as received by transformer 172 contains only the fundamental component. Therefore, it is only needed that transformer 172 handles only the fundamental frequency. In this respect, the requirements for the transformer, such as broad band and low loss, are less strict than those of the prior art. This fact allows a relatively small transformer to be used for this transmission transformer, with little heating of it due to the harmonics.

As seen from the foregoing description, this invention employs two separate circuits respectively for the impedance transformation and the circuit system transformation, whereas the prior art uses a single circuit for the same. Specifically, design restrictions on the transformer are not strict, because it is used for only the balance-to-unbalance transformation. Therefore, use of a relatively small transformer is allowed, leading to cost reduction and easy design. Further, LC impedance transformation circuit is used only for the impedance transformation. In the impedance transforming circuit, those circuit parameters are relatively flexibly selected. This indicates that a designer may obtain an optimum impedance transforming ratio easily.

At least some circuit components of the impedance and circuit system transforming circuits may be fabricated on a strip line according to the distribution constants methodology. This leads to the reduction of the resultant device.

It is noted that the matching circuits of the above-mentioned embodiments are each reversible. Each matching circuit is applicable for matching the unbalanced feeder of 50 ohms to the 300-ohm balanced folded dipole antenna. Normal transformers may be used for those of the 1st to 3rd embodiments. If the transformer is originally designed for the transmission transformer, however, a further reduction of transformer size is possible, because only the necessary frequency passage is required.

What is claimed is:

1. A matching circuit with a pair of balanced signal input terminals and an unbalanced signal output terminal, comprising:-
    impedance transforming means having first and second input terminals connected to said pair of balanced signal input terminals, and first and second output terminals, a filter circuit being interposed between said first and second input terminals and said first and second output terminals, said filter circuit exhibiting a low impedance for the frequency of a signal to be transmitted from said first and second input terminals to said first and second output terminals and exhibiting a high impedance for a frequency which is higher than the frequency of the signal to be transmitted;
    balance-to-unbalance transforming means having third and fourth input terminals, an output terminal connected to said unbalanced signal output terminal, a reference potential point, and a transformer including at least first and second windings, said first winding being interposed between the third input terminal and the output terminal, and said second winding being interposed between the fourth input terminal and the reference potential point; and
    DC component blocking means including a coupling capacitor for removing DC components, through which the first output terminal of said impedance transforming means is connected to the third input terminal of said balance-to-unbalance transforming means, and a coupling capacitor for removing DC components, through which the second output terminal of said impedance transforming means is connected to the fourth input terminal of said balance-to-unbalance transforming means.

2. The matching circuit according to claim 1, in which said filter circuit of said impedance transforming means includes a combination of inductive and capacitive elements.

3. The matching circuit according to claim 1, in which said transformer used in said balance-to-unbalance transforming means includes a third winding which is connected between one end of said first winding and said reference potential point to allow a current to flow therethrough in the opposite direction to that of the currents flowing through said first winding.

4. The matching circuit according to claim 1, in which said pair of balanced signal input terminals are connected to a pair of output terminals of a high frequency power amplifier of balanced signal output operating in class D mode, and said unbalanced signal output terminal is connected to the input terminal of a load circuit of the unbalanced signal input.

5. A matching circuit with a pair of balanced signal input terminals and an unbalanced signal output terminal, comprising:

impedance transforming means having first and second input terminals connected to said pair of balanced signal input terminals, and first and second output terminals, a filter circuit including a combination of inductive and capacitive elements and being interposed between said first and second input terminals and said first and second output terminals, said filter circuit exhibiting a low impedance for the frequency of a signal to be transmitted from said first and second input terminals to said first and second output terminals and exhibiting a high impedance for a frequency which is higher than the frequency of the signal to be transmitted, said capacitive element of said filter circuit functioning as a coupling capacitor for removing DC components from a signal transmitted from said first and second input terminals to said first and second output terminals, and balance-to-unbalance transforming means having third and fourth input terminals, an output terminal connected to said unbalanced signal output terminal, a reference potential point, and a transformer including at least first and second windings, said first winding being interposed between the third input terminal and the output terminal, and said second winding being interposed between the fourth input terminal and the reference potential point.

6. The matching circuit according to claim 5, in which said transformer used in said balance-to-unbalance transforming means includes a third winding which is connected between one end of said first winding and said reference potential point to allow a current to flow therethrough in the opposite direction to that of the currents flowing through said first winding.

7. The matching circuit according to claim 5, in which said pair of balanced signal input terminals are connected to a pair of output terminals of a high frequency power amplifier of balanced signal output operating in class D mode, and said unbalanced signal output terminal is connected to the input terminal of a load circuit of the unbalanced signal input.

8. A matching circuit with a pair of balanced signal input terminals and an unbalanced signal output terminal, comprising:

balance-to-unbalance transforming means having first and second input terminals connected to said pair of balanced signal input terminals, an output terminal, a reference potential point, and a transformer including at least first and second windings, said first winding being interposed between the first input terminal and the output terminal, and said second winding being interposed between the second input terminal and the reference potential point;

impedance transforming means having an input terminal connected to the output terminal of said balance-to-unbalance transforming means and an output terminal connected to said unbalanced signal output terminal, a filter circuit being interposed between said input and output terminals, said filter circuit exhibiting a low impedance for the frequency of a signal to be transmitted from said input terminal to said output terminal and exhibiting a high impedance for a frequency which is higher than the frequency of the signal to be transmitted; and DC component blocking means including a coupling capacitor for removing DC components which is interposed between the output terminal of said balance-to-unbalance transforming means and the input terminal of said impedance transforming means and a coupling capacitor for removing DC components which is interposed between the second input terminal of said balance-to-unbalance transforming means and the reference potential point.

9. The matching circuit according to claim 8, in which said filter circuit of said impedance transforming means includes a combination of inductive and capacitive elements.

10. The matching circuit according to claim 8, in which said transformer used in said balance-to-unbalance transforming means includes a third winding which is connected between one end of said first winding and said reference potential point to allow a current to flow therethrough in the opposite direction to that of the currents flowing through said first winding.

11. The matching circuit according to claim 8, in which said pair of balanced signal input terminals are connected to a pair of output terminals of a high frequency power amplifier of balanced signal output operating in class D mode, and said unbalanced signal output terminal is connected to the input terminal of a load circuit of the unbalanced signal input.

12. A matching circuit with a pair of balanced signal input terminals and an unbalanced signal output terminals, comprising:

balance-to-unbalance transforming means having first and second input terminals connected to said pair of balanced signal input terminals, an output terminal, a reference potential point, and a transformer including at least first and second windings, said first winding being interposed between the first input terminal and the output terminal, and said second winding being interposed between the second input terminal and the reference potential point;

impedance transforming means having an input terminal connected to the output terminal of said balance-to-unbalance transforming means and an output terminal connected to said unbalanced signal output terminal, a filter circuit including a combination of inductive and capacitive elements and being interposed between said input and output terminals, said filter circuit exhibiting a low impedance for the frequency of a signal to be transmitted from said first input terminal to said output terminal and exhibiting a high impedance for a frequency which is higher than the frequency of the signal to be transmitted, said capacitive element of said filter circuit functioning as a coupling capacitor for removing DC components from a signal transmitted from said input terminal to said output terminal.

13. The matching circuit according to claim 12, in which said transformer used in said balance-to-unbalance transforming means includes a third winding which is connected between one end of said first winding and said reference potential point to allow a current to flow therethrough in the opposite direction to that of the currents flowing through said first winding.

14. The matching circuit according to claim 12, in which said pair of balanced signal input terminals are connected to a pair of output terminals of a high frequency power amplifier of balanced signal output operating in class D mode, and said unbalanced signal output terminal is connected to the input terminal of a load circuit of the unbalanced signal input.

* * * * *